United States Patent [19]
Addor

[11] 4,215,314
[45] Jul. 29, 1980

[54] DEPHASER CIRCUIT

[75] Inventor: Francis Addor, Neuchâtel, Switzerland

[73] Assignee: Ebauches S.A., Neuchâtel, Switzerland

[21] Appl. No.: 857,182

[22] Filed: Dec. 2, 1977

[30] Foreign Application Priority Data

Dec. 21, 1976 [CH] Switzerland ................. 16066/76

[51] Int. Cl.² ........................................... H03K 5/18
[52] U.S. Cl. ....................................... 328/55; 328/155
[58] Field of Search ................................ 328/55, 155

[56] References Cited

U.S. PATENT DOCUMENTS

| | | | |
|---|---|---|---|
| 3,500,214 | 3/1970 | Broadhead et al. | 328/55 X |
| 3,629,715 | 12/1971 | Brown | 328/155 |
| 3,714,589 | 1/1973 | Lewis | 328/155 |
| 3,833,854 | 9/1974 | Schonover | 328/155 |
| 4,013,969 | 3/1977 | Dennison | 328/155 |
| 4,095,186 | 6/1978 | Vesel | 328/55 X |

*Primary Examiner*—John S. Heyman
*Attorney, Agent, or Firm*—Wender, Murase & White

[57] ABSTRACT

The invention relates to a phase-shifting circuit for providing a signal out of phase by an amount $\Delta\Phi$ digitally predetermined with respect to the phase of a reference signal and which can be any function of time or another variable or a constant. The circuit comprises a digital divider receiving an input reference signal and delivering an output signal whose phase is measured by a number detected at the set of outputs of the divider, this number being fed to the input of a digital arithmetic circuit to be therein added to a signal delivered by a binary number generator which determines the phase-shift $\Delta\Phi$. The output of the arithmetic circuit is a signal out of phase of an amount $\Delta\Phi$ with respect to the signal at the output of the divider circuit.

8 Claims, 6 Drawing Figures

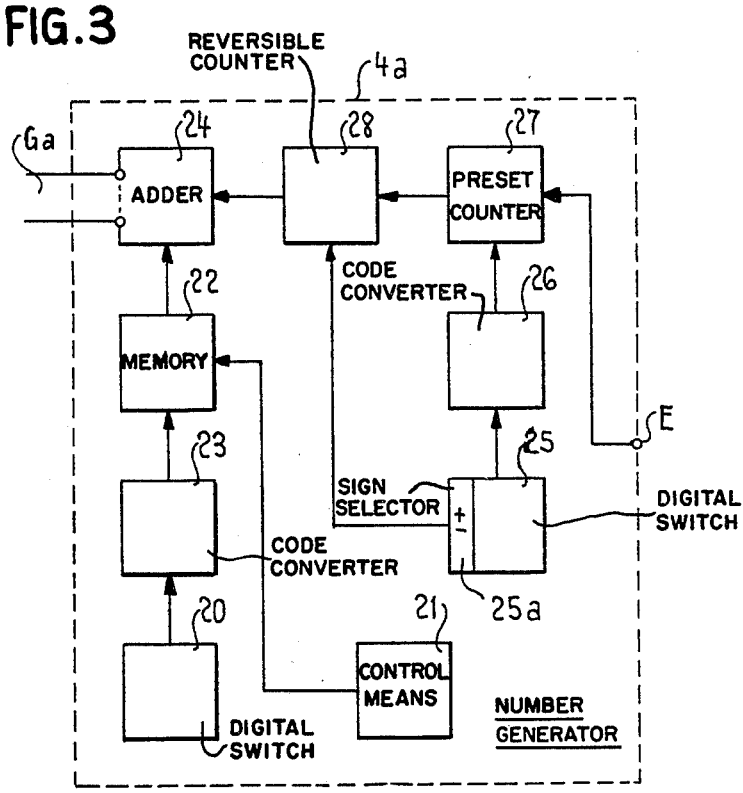
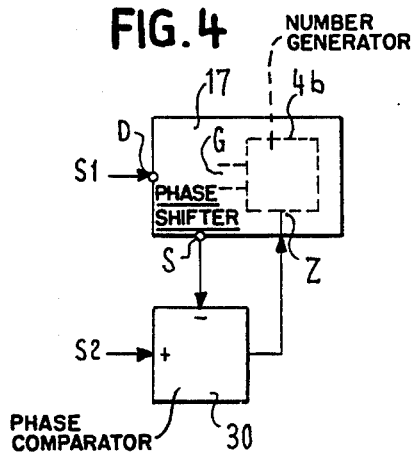
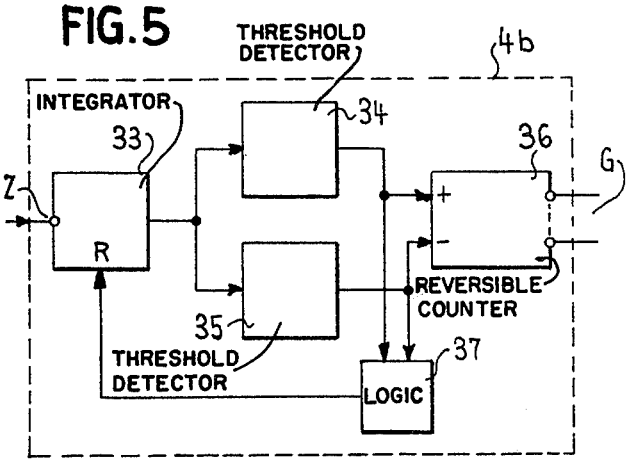

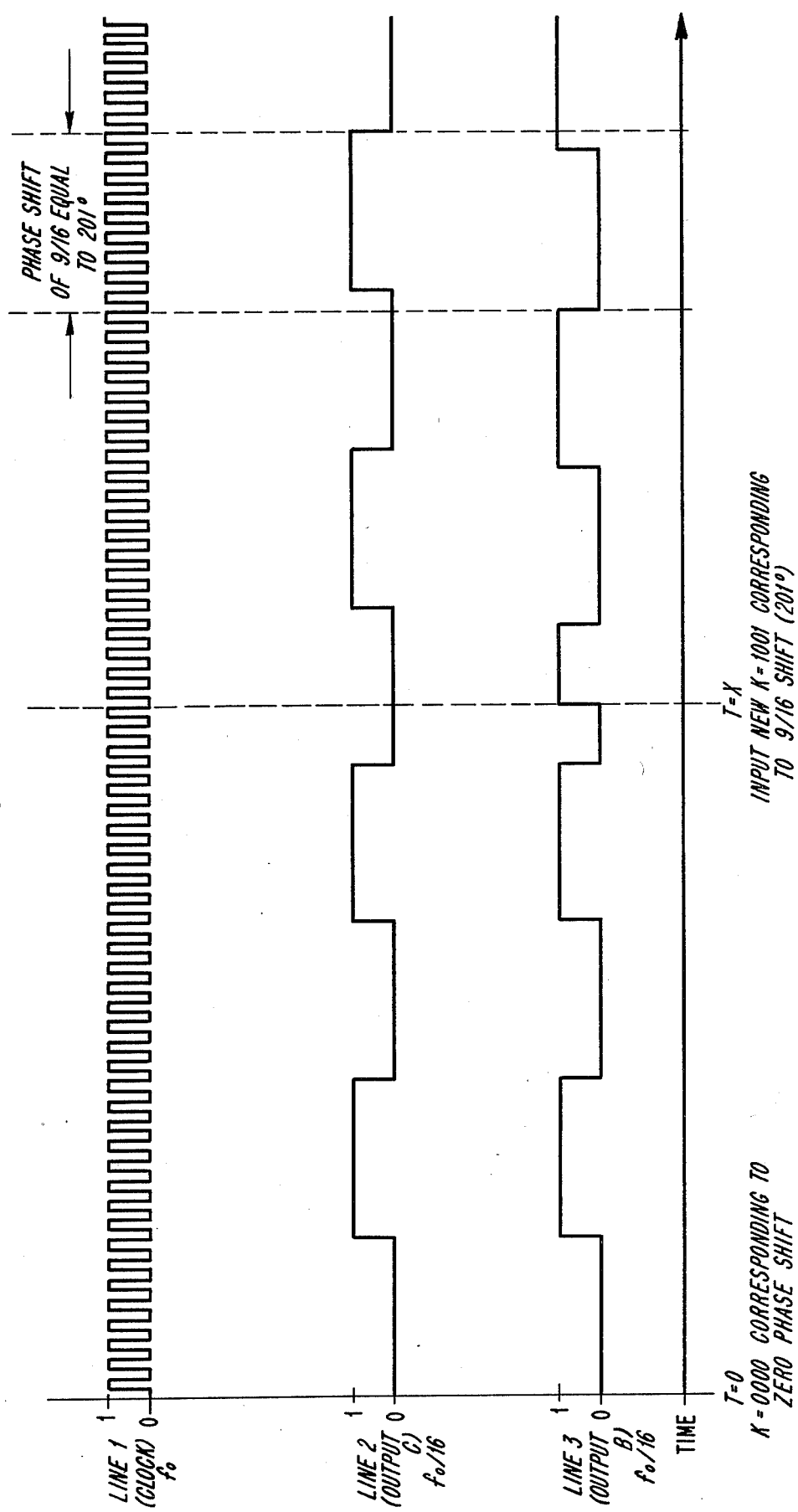

DEPHASER CIRCUIT

BACKGROUND OF THE INVENTION

The present invention relates to phase-shifting a circuit for providing a signal phase-shifted by an angle $\Delta\Phi$ predetermined with respect to the phase of a reference signal; this phase-shift $\Delta\Phi$ can be any function of time or a constant.

According to the present invention there is provided a phase-shifting circuit having a first input adapted to receive a first periodic frequency signal $f_o$, comprising a digital counter having N stages, of capacity $2^N$, the input of which is connected, at least indirectly, to the input of the phase-shifting circuit, and whose output delivers a second periodic frequency signal $f_o/2^N$, a number generator, the output of which presents a number K, and a first arithmetic digital circuit the inputs of which are connected, respectively, to the output of the digital counter and to the output of the number generator, and the output of which delivers a third periodic signal, the second and the third periodical signals having equal frequencies and a difference of phase determined by the number K.

The present invention will be described further, by way of example, with reference to the accompanying drawings.

BRIEF DESCRIPTION OF THE DRAWINGS

FIG. 3 is a block diagram of an embodiment of a binary number generator usable as an element of the circuit of FIG. 1;

FIG. 4 is a block diagram of another application of the phase-shifting circuit according to the present invention; and FIG. 5 is a block diagram of one of the circuits of FIG. 4.

FIG. 6 is a timing diagram of the second and third periodic signals output by the circuit of FIG. 1 in response to the input of a first periodic signal.

DETAILED DESCRIPTION OF THE INVENTION

Figure 1:
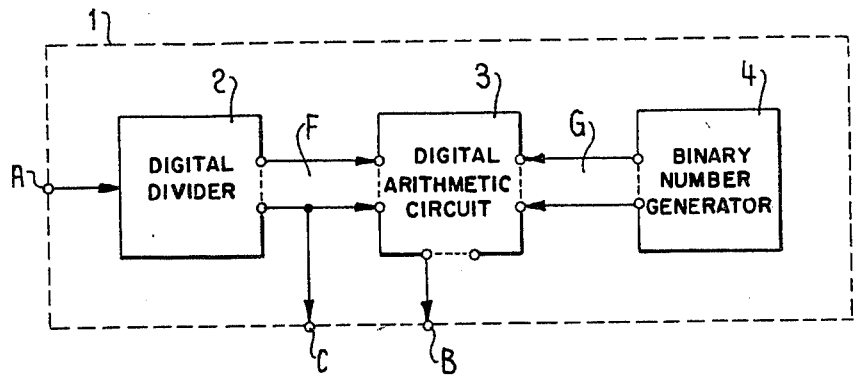
FIG. 1 is a block diagram of a phase-shifting circuit according to the present invention.

The phase-shifting circuit 1, schematically represented in FIG. 1, comprises a digital divider 2, a digital arithmetic circuit 3 and a binary number generator 4. Digital arithmetic circuit 3 may be of any suitable type, such as the commercially available 4-bit binary full adders available from Texas Instruments, Inc. under Type Nos. SN 5483 or SN 7483 and from RCA under Type No. CD 4008 B.

The digital divider 2, comprising N divider stages each consisting of a flip-flop, is used as a counter and accumulates the whole periods of the pulses of frequency $f_o$ applied at its input A; this divider is arranged to present on its outputs logical states corresponding to the series of natural numbers expressed in binary form.

The instantaneous number M which can be detected on the set of outputs F of the divider, and which varies from 0 to $2^N-1$ during each counting cycle, evolves in the course of time as the phase $\Phi_c$ of the signal delivered to the terminal C by the last stage of the divider. This phase itself varies from 0 to $2\pi$ radians. The number M is thus a digital measure of $\Phi_c$ which can be expressed by:

$$\Phi_c = \frac{M}{2^N} \cdot 2\pi$$

With respect to the phase $\Phi_o$ of the frequency signal $f_o$ applied at the input A, this phase is given by:

$$\Phi_c = \frac{\Phi_o}{2^N} = \frac{2\pi \cdot f_o \cdot t + \phi_o}{2^N}$$

where $\phi_o$ is the phase of the input signal at the instant $t_o$.

The basic idea of the invention is to add to the number M a certain number K generated by the generator 4. The sum $M+K$ then represents a number which evolves as the phase of the input signal, with a time delay $\Delta\Phi$ determined by the number K. This time delay can be constant or vary as a function of time or any other variable.

If, indeed, the same format is chosen for K as for M, i.e. the same number of bits, then:

$$K = \Delta\Phi \cdot \frac{2^N}{2\pi}$$

$$\text{and: } M + K = (\Phi_c + \Delta\Phi) \cdot \frac{2^N}{2\pi}$$

$$\text{or also: } \Phi_c + \Delta\Phi = (M + K) \cdot \frac{2\pi}{2^N}$$

To effect such an operation, the outputs F of the divider are connected to a first series of inputs of the arithmetic circuit 3, which is an addition circuit; a second series of inputs is connected to the number generator 4 by the connections referenced by the letter G. The outputs of the circuit 3 thus present the number $M+K$, and the signal delivered by the most significant output to the terminal B of the circuit 1 has a phase:

$$\Phi_b = \Phi_c + \Delta\Phi = \frac{\Phi_o}{2^N} + \Delta\Phi$$

where $\Delta\Phi$ is a function formed by the number generator 4.

An exemplary operation of the phase-shifting circuit 1 is shown in the timing diagram of FIG. 6 for the case of $N=4$. Line 1 of FIG. 6 represents a periodic clock signal of frequency $f_o$ presented to input terminal A of the phase-shifting circuit 1, while Lines 2 and 3 correspond, respectively, to the reference output signal delivered to terminal C and the phase-shifted output signal delivered to terminal B, both being of frequency $f_o/2^N$, i.e., $f_o/16$.

Considering the case where no phase shift between the output signals at terminals B and C is desired, corresponding to $K=0000$, the output at B is identical to the output at C and will remain as such as long as $K=0000$. However, if K is changed at time $T=X$ to produce a shift of 9/16 in phase (approximately 201°), which corresponds to $K=1001$ in this example, a phase shift occurs immediately between the two output signals. This is shown in FIG. 6 as a shift in the output signal at B with reference to the output signal at C, so that transitions of the signal at B (Line 3) occur nine clock pulses (Line 1) before transitions in the signal at C (Line 2). It can be appreciated from the timing diagram that this shift occurs instantaneously upon the delivery of a new binary number K, so that the output signal at C is equal at all times to the true sum of the binary numbers M and K. This shift in phase between the output signals will remain as such as long as $K=1001$.

The phase-shifting circuit 1 can be used as a phase-shifter, as a frequency mixer, or even in control or phase coding systems; its main advantage being that it is a digital arrangement, thus easily reproducible, and giving a very good resolving power.

Figure 2:
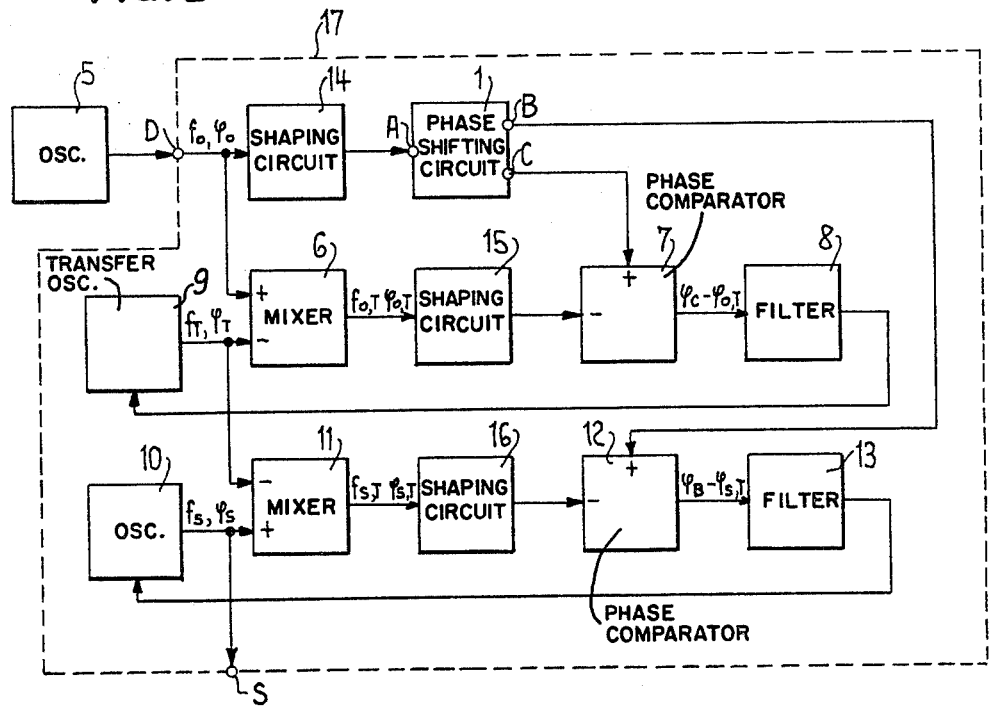
FIG. 2 is a block diagram of a first application of the circuit of FIG. 1.

FIG. 2 shows a particular use of the phase-shifting circuit 1, permitting a signal to be obtained having a frequency which is identical to that of an input signal, but which is phase-shifted by a predetermined angle $\Delta\Phi$ and selected digitally. The angle $\Delta\Phi$ can be varied by small increments, the sum of which is not limited to $2\pi$ radians. The circuit 17 of FIG. 2 is in fact a quasi-continuous phase-shifting circuit.

An oscillator 5 delivers to the input D of the circuit 17 a signal having a phase $\Phi_o=2\pi\cdot f_o+\phi_o$ which is, if necessary, transformed into pulses of the same frequency $f_o$ by a shaping circuit 14; these pulses are delivered to the input A of the phase-shifting circuit 1, the output C of which then delivers pulses of the frequency $f_c=f_o/2^N$ and of a phase $\Phi_c=\Phi_o/2^N$, and the output B delivers a signal of the same frequency, but having a phase $\Phi_b=(\Phi_o/2^N)+\Delta\Phi$, $\Delta\Phi$ being determined by the number generator 4.

On the other hand, by means of the frequency mixer 6, beats are provided between the oscillator 5 and a transfer oscillator 9, having a frequency tuning input and delivering signals of frequency $f_T$ and of a phase $\Phi_T$. After shaping in a circuit 15, the phase $\Phi_{o,T}=\Phi_o-\Phi_T$ of these beats is compared with the signal delivered by the terminal C of the phase-shifting circuit 1 in a phase comparator 7. This comparator 7 delivers a continuous voltage proportional to the phase difference $\Phi_c-\Phi_{o,T}$ which is utilized to control the oscillator 9 via the filter 8. This control loop is so arranged that the phase difference is continuously brought back to 0. One then has:

$$\Phi_c-\Phi_{o,T}=0$$

or:

$$\frac{\Phi_0}{2^N}-\Phi_o+\Phi_T=0$$

or also:

$$\Phi_T=\Phi_o(1-1/2^N).$$

Similarly one has:

$$f_T=f_o(1-1/2^N).$$

This type of control circuit is well known under the name of "Phase Locked Loop".

A second control loop of this type, comprising an output oscillator 10 delivering a signal of phase $\Phi_s$ and of frequency $f_s$, a frequency mixer 11, a shaping circuit 16, a phase comparator 12 and a filter 13, permit the control of the output oscillator 10; the mixer 11 delivers beats of frequency $f_{s,T}=f_s-f_T$ and of phase $\Phi_{s,T}=\Phi_s-\Phi_T$ resulting from the superposition of voltages provided by the oscillators 9 and 10. The comparator 12 compares the phase of these beats and that of the signal delivered by the terminal B of the circuit 1.

The control condition of the loop then gives:

$$\Phi_b-\Phi_s+\Phi_T=0$$

or:

$$(\Phi_o/2^N)+\Delta\Phi-\Phi_s+\Phi_T=0$$

From which, taking into account the preceding relationship:

$$\Phi_s=\Phi_o+\Delta\Phi$$

On the other hand one has:

$$f_s=f_T+(f_o/2^N)=f_o$$

This shows that the output signal presents the same frequency as the reference signal with a dephasing of $\Delta\Phi$.

The resolution $\Delta\Phi_{min}$ of this circuit, that is to say the smallest possible phase-shift, is given by $\Delta\Phi_{min}=2\pi/2^N$. With $N=8$, one has $2^N=256$, and $\Delta\Phi_{min}=2.454\times10^{-2}$ radians, which corresponds, for an input frequency of 5 MHz, to a time of $0.78125\times10^{-9}$ seconds.

It is to be noted here that these very small values are obtained with a circuit using known elements, freely available, and that its manufacture does not pose any problems to one skilled in the art.

This phase-shifting circuit enables the development of a signal derived from a reference signal the phase of which, with respect to the reference signal, can be controlled in any manner, as a function of time or of any parameter. All that is required is the provision of an adequate number generator; one can even, for a complicated case, use a computer as a number generator. Thus, the phase-shifting circuits permit resolving the following problem:

Supposing a clock H the date $T_H$ of which (that is to say, in accordance with the terminology used more and more frequently in time measuring laboratories, the visible indication on the display of the clock) obeys the following model:

$$T_H=T_i+\Delta T_H$$

with $$\Delta T_H=R.\ (t-t_o)+\Delta T_{to}+x_H$$

where $\Delta T_H$ is the state of the clock H, i.e. the difference between the date $T_H$ and the date $T_i$ of an ideal clock, at a time t, R is the running of the clock H, or difference of state for a unit of time, $\Delta T_{to}$ is the state of the clock H at the time $t_o$, and $x_H$ is a term representing the influence of the non-systematic fluctuations.

One wants to produce, starting with this clock H, a system of time measurement producing a date the systematic variations of which with respect to the ideal clock are annulled.

The date displayed by a clock can be measured by the size of the phase of the signal $S_H$ delivered by the time base of this clock, thus one can write the above relationship in terms of phase, on the assumption that the nominal frequency of the signal delivered by the time base of the clock H is equal to the frequency of the signal delivered by the time base of the ideal clock:

$$\Delta\Phi_H = P \cdot (t - t_o) + \Delta\Phi_{to} + y_H$$

where $\Delta\Phi_H$ is the difference between the phase $\Phi_H$ of the clock H and the phase $\Phi_i$ of the ideal clock, at the time t, P is the value of this phase difference, measured in radians for a unit of time, $\Delta\Phi_{to}$ is the difference of the phase at the time $t_o$, and $y_H$ is again a term representing the effect of non-systematic fluctuations.

The solution to the problem set consists in using the signal $S_H$ as an input signal in the dephaser 17 of FIG. 2 and creating in the generator 4 a number K such that $K \cdot \Delta\Phi_{min} = -\Delta\Phi_H$. The output signal of the phase-shifting circuit 17 will thus present no variation of phase with respect to the ideal signal, without the near non-systematic fluctuations excepted.

This condition can be rewritten (neglecting the term $y_H$):

$$K \cdot \Delta\Phi_{min} = -(P(t - t_o) + \Delta\Phi_{to}).$$

K can be separated into two parts, one constant and the other variable as a function of time:

$$K = K_1 + K_2$$

with $$K_1 \cdot \Delta\Phi_{min} = -P(t - t_o)$$

and $$K_2 \cdot \Delta\Phi_{min} = -\Delta\Phi_{to}$$

It is to be noted that $K_1$ and $K_2$ can be considered as being always positive; if, in fact, $\Delta\Phi_{to}$ or $P(t-t_o)$ are positive, one could always subtract $2\pi$ radians therefrom and thus obtain a negative value which would be used for the calculation of $K_1$ and of $K_2$. The sign of the variation of $K_1$ as a function of time must be opposite to the sign of P.

FIG. 3 shows the block diagram of a generator 4a capable of providing this number K which comprises a digital switch 20, susceptible to display the number $K_2$, which can be easily calculated knowing $\Delta\Phi_{to}$ and $\Delta\Phi_{min}$. The switch 20 is connected to a memory 22 via a code converter 23. The memory 22 stores the number $K_2$ in response to a signal delivered by a control means 21, which may be simply, for example, a contact operated by a push button and delivering a registering pulse when it is closed. The code converter 23 serves to convert the number $K_2$, which is displayed on the switch 20 in a decimal code for more convenience, into a binary number the code and the format of which are compatible with the rest of the circuit. The control means 21 prevents the contents of the memory 22 from changing in an undesired manner, while one modifies, for one reason or another, the number displayed on the switch 20.

The magnitude P represents the variation of the phase (in radians/seconds for example), and its inverse 1/P represents therefore the time taken by the phase of the clock H to vary by one radian from the phase of the ideal clock. The time $\rho = \Delta\Phi_{min}/P$ is thus the time taken by the phase of the clock H to vary from that of the ideal clock by a quantity equal to the increment $\Delta\Phi_{min}$ of the dephaser circuit 17. It will thus be necessary to increase, if P is negative, or reduce, if P is positive, the number $K_1$ by 1 unit every $\rho$ seconds to obtain the required variation of K. To make this variation, the generator 4a comprises, in addition to the circuits described above, a second digital switch 25 having an associated sign selector 25a, a second code converter 26, a presettable counter 27 and a reversible counter 28. The number $\rho$, displayed on the switch 25 in decimal form, is transmitted, in binary form, by the converter 26 to the pre-selection inputs of the counter 27. The counting input of this counter 27 receives impulses having a frequency of 1 Hz, provided, for example, by a frequency divider not shown, the input of which is connected to the output S of the phase-shifting. Each time the counter 27 reaches the number displayed on the switch 25, it returns-to-zero and delivers a pulse to the counter 28, the content of which is increased or reduced by one unit in accordance with the sign, opposite to the sign of P, displayed by the sign selector 25a. The output of this counter 28 thus presents a number which increases or decreases by one unit every $\rho$ seconds, which is the adjustment sought for the number $K_1$.

The generator 4a also comprises an adder 24 the inputs of which are connected to the outputs of the memory 22 and to the outputs of the counter 28, and the output of which thus presents the number $K = K_1 + K_2$.

In these conditions, the output of the phase-shifting circuit 1 thus presents a signal of the same frequency as the signal $S_H$, the phase of which is given by $$\Phi_s = \Phi_H + K \cdot \Delta\Phi_{min}$$

As $$\Phi_H = \Phi_i + \Delta\Phi_H$$

and since $K \cdot \Delta\Phi_{min}$ is just equal to $-\Delta\Phi_H$, it is clear that $$\Phi_s = \Phi_i$$

which is the result sought.

One can note that, in this application, the phase $\Phi_T$ of the transfer oscillator 9 must follow as rapidly as possible the phase of the signal $S_H$. The filter 8 must have a small time constant, which on the other hand permits an LC oscillator to be used as the oscillator 9. In the second control loop, on the other hand, the phase must be followed with precision while becoming free of the random fluctuations due to the noise produced by the different elements of the circuit, so as to furnish as stable an output signal as possible. It is for this reason that it is necessary to choose for the filter 13 of this second loop a large time constant, so as to eliminate the rapid undesirable fluctuations. This necessitates the use of an oscillator 10 of great stability.

One can likewise note that, as the case may be, the generator 4a could only be composed of the elements delivering the number $K_1$, or only of the elements delivering the number $K_2$. The adder 24 would not then be necessary.

FIG. 4 illustrates another application of the phase-shifting circuit 17 of FIG. 2. The problem here is to measure with precision the difference between the phases of two signals $S_1$ and $S_2$.

The signal $S_1$ is applied at the input D of the dephaser circuit 17. The signal $S_2$ is itself applied as an input of a phase comparator 30 the second input of which receives the output signal of the dephaser 17. The output of this comparator 30 attacks the input Z of the number generator 4b, which, in this case, comprises, in accordance with FIG. 5, an integrator 33, two threshold detectors 34 and 35, a reversible counter 36 and a logic circuit 37. The threshold detectors 34 and 35 operate so as to deliver a pulse at the increment input and the decrement input, respectively, of the counter 36, each time that the output voltage of the integrator 33 attains a certain positive or negative value, respectively.

In each of these two cases, the pulse delivered by the threshold detector is equally also applied at the reset input R of the integrator via the logic circuit 37, which causes the return-to-zero of the output voltage of this integrator.

The output of the generator 4b, which is constituted by the output of counter 36, continuously provides a binary number which is a measure of the phase difference between the signals $S_1$ and $S_2$.

In fact, in admitting for simplification that, at the beginning, $S_1$ and $S_2$ are exactly in phase, and that the counter 36 is at 0, the output signal of the phase-shifting circuit is in phase with $S_2$ and the output of the integrator circuit 33 is at 0.

The integrator 33 is arranged in such a manner that its output becomes positive if the signal $S_2$ advances with respect to $S_1$, and negative in the opposite case. If $S_2$ starts to advance, the threshold detector 34 delivers a pulse to the counter 36 when the output voltage of the integrator 33 attains a certain value. The content of the counter 36 is thus augmented by one unit, which effects the advance of the phase of the output signal of the phase-shifting by a quantity $\Delta\Phi_{min}$ and tends to bring back to 0 the output voltage of the comparator 30. If this compensation is sufficient, the circuit remains in this state; if not, the output voltage of the integrator 33 starts to increase again, and the counter 36 is again incremented. The process is repeated until the output signal of the phase-shifting circuit 1 is in phase with the signal $S_2$. The content of the counter 36, which is available on its output, thus continuously indicates, in a binary form, the phase difference between the signals $S_1$ and $S_2$.

If $S_2$ lags behind with respect to $S_1$, the counter 36 is decremented by the impulses delivered, in this case, by the detector 35. With that exception, the functioning of the circuit remains the same.

It is evident that the counter 36 must have the same number N of stages as the divider 2. The resolution of the measure is thus the same as that of the phase-shifting circuit, namely $2\pi/2^N$.

What we claim is:

1. A phase-shifting circuit adapted to receive a first periodic signal of frequency $f_o$ comprising:
   a digital counter having N stages for cyclically counting the number of periods of the signal of frequency $f_o$ and delivering in response thereto a second periodic signal of frequency $f_o/2^N$ represented by a binary number M;
   a number generator for providing a selectable binary number K;
   digital adder means connected to said counter and said number generator for receiving said number M and said number K and instantaneously delivering a binary number M+K equal at all times to the true sum of said number M and said number K, said number M+K corresponding to a third periodic signal equal in frequency to said second periodic signal and having a phase shift therebetween of an amount determined by said number K.

2. A phase-shifting circuit according to claim 1, wherein said number generator comprises means providing a number K of constant value, said means being capable of modifying said value in an arbitrary manner.

3. A phase-shifting circuit according to claim 2, wherein said means comprises a digital switch for producing and entering a number, a memory connected to said switch to record said number in response to a control signal, and a control means for delivering said control signal to said memory, the output of said memory being connected to the output of said number generator.

4. A phase-shifting circuit according to claim 1, wherein said number generator comprises means for modifying the number K in a predetermined manner.

5. A phase-shifting circuit according to claim 4, wherein said number generator has an input adapted to receive a fourth periodic signal, and wherein said modifying means comprises a digital switch for producing and entering a second number; a sign selector for producing and entering the sign of said second number; a preset counter for counting said fourth periodic signal and adapted to be preset by said second number, said preset counter having a preset input connected to said digital switch and having a clock input connected to said input of said number generator; and a first reversible counter having a clock input connected to the output of said preset counter for counting the output pulses of said preset counter, and having a counting direction determination input connected to said sign selector for controlling the direction of counting, the output of said reversible counter being connected to the output of the number generator.

6. A phase-shifting circuit according to claim 1, wherein said number generator comprises first means having a first digital switch for producing and entering a first number, a memory connected to said first switch to record said first number in response to a control signal, and a control means for delivering said control signal to said memory; wherein said number generator has an input adapted to receive a fourth periodic signal and further comprises second means having a second digital switch for producing and entering a second number, a sign selector for producing and entering the sign of said second number, a preset counter for counting said fourth periodic signal and adapted to be preset by said second number, said preset counter having a preset input connected to said second digital switch and having a clock input connected to said input of said number generator, and a first reversible counter having a clock input connected to the output of said preset counter for counting the output pulses of said preset counter, and having a counting direction determination input connected to said sign selector, for controlling the direction of counting; and wherein said number generator further comprises second digital adder means for adding the output signals of said memory and said reversible counter, the outputs of said memory and said reversible counter being respectively connected to a first and a second input of said second adder means, the output of said second adder means being connected to the output of the number generator.

7. A phase-shifter in accordance with claim 1, comprising a first phase control circuit having a frequency mixing input connected to the input of the phase-shifting circuit and having a phase comparison input connected to the output of said digital counter so that the frequency and the phase of the output signal of the first phase control circuit are maintained equal to the differences between the frequencies and, respectively, the phases of the first and of the second periodic signal; and a second phase control circuit having a frequency mixing input connected to the output of said first phase control circuit and having a phase comparison input connected to the output of said digital adder means so that the frequency of the output signal of said second phase control circuit is equal to the frequency of the first periodic signal and its phase differs from that of the first periodic signal by a quantity determined by the number K.

8. A phase-shifter in accordance with claim 7, in which said output of the second phase control circuit is connected to a first input of a phase comparator, said phase comparator having a second input adapted to receive a fifth periodic signal; and wherein said number generator comprises a reversible counter, having an output connected to the output of the number generator, and having incrementation and decrementation inputs respectively connected each through a threshold detector to an output of an integrator, said integrator having an integration input connected to an output of said phase comparator and having a reset input connected through a logic circuit to outputs of said threshold detectors, so that the output of the number generator presents a number determined by the phase difference existing between said first and said fifth periodic signals.

* * * * *